(12) United States Patent
Karim et al.

(10) Patent No.: US 7,915,715 B2
(45) Date of Patent: Mar. 29, 2011

(54) SYSTEM AND METHOD TO PROVIDE RF SHIELDING FOR A MEMS MICROPHONE PACKAGE

(75) Inventors: Nozad O. Karim, Chandler, AZ (US); Bob Shih Wei Kuo, Chandler, AZ (US); Jingkun Mao, Maricopa, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 44 days.

(21) Appl. No.: 12/323,124

(22) Filed: Nov. 25, 2008

(65) Prior Publication Data

US 2010/0127376 A1    May 27, 2010

(51) Int. Cl.
*H01L 23/552* (2006.01)
(52) U.S. Cl. .. 257/660; 257/659; 257/728; 257/E23.114
(58) Field of Classification Search .................. 257/659, 257/660, 728, E23.114
See application file for complete search history.

(56) References Cited

U.S. PATENT DOCUMENTS

| | | |
|---|---|---|
| 4,925,024 A | 5/1990 | Ellenberger et al. |
| 5,166,772 A | 11/1992 | Soldner et al. |
| 5,416,358 A | 5/1995 | Ochi et al. |
| 5,468,999 A | 11/1995 | Lin et al. |
| 5,473,191 A | 12/1995 | Tanaka |
| 5,557,142 A | 9/1996 | Gilmore et al. |
| 5,614,694 A | 3/1997 | Gorenz, Jr. et al. |
| 5,639,989 A | 6/1997 | Higgins, III |
| 5,656,864 A | 8/1997 | Mitsue et al. |
| 5,694,300 A | 12/1997 | Mattei et al. |
| 5,907,477 A | 5/1999 | Tuttle et al. |
| 5,940,271 A | 8/1999 | Mertol |
| 6,136,131 A | 10/2000 | Sosnowski |
| 6,194,655 B1 | 2/2001 | Lange, Sr. et al. |
| 6,246,115 B1 | 6/2001 | Tang et al. |
| 6,423,570 B1 | 7/2002 | Ma et al. |
| 6,433,420 B1 | 8/2002 | Yang et al. |
| 6,465,280 B1 | 10/2002 | Martin et al. |
| 6,602,737 B2 | 8/2003 | Wu |
| 6,686,649 B1 | 2/2004 | Mathews et al. |
| 7,030,469 B2 | 4/2006 | Mahadevan et al. |
| 7,166,910 B2 | 1/2007 | Minervini |
| 7,242,089 B2 | 7/2007 | Minervini |
| 2002/0089832 A1 | 7/2002 | Huang |
| 2003/0067757 A1 | 4/2003 | Richardson et al. |
| 2005/0280139 A1 | 12/2005 | Zhao et al. |
| 2006/0157841 A1 | 7/2006 | Minervini |
| 2007/0013052 A1* | 1/2007 | Zhe et al. ..................... 257/704 |
| 2007/0030661 A1 | 2/2007 | Morris et al. |

* cited by examiner

*Primary Examiner* — Victor Mandala
(74) *Attorney, Agent, or Firm* — Weiss & Moy, P.C.

(57) ABSTRACT

A semiconductor package has a substrate. An opening is formed through the substrate. A first RF shield is formed around a perimeter of the opening. A first die is attached to the first surface of the substrate and positioned over the opening.

17 Claims, 4 Drawing Sheets

SYSTEM AND METHOD TO PROVIDE RF SHIELDING FOR A MEMS MICROPHONE PACKAGE

FIELD OF THE INVENTION

This invention relates to a Micro-Electro-Mechanical Systems (MEMS) microphone package, and, more specifically, to a system and method that reduces the Electro-Magnetic Interference (EMI) and Radio Frequency (RF) interference pick-up by a MEMS microphone package.

BACKGROUND OF THE INVENTION

Radio Frequency (RF) shielding is required on certain semiconductor devices and modules (hereinafter semiconductor device) in order to minimize Electro-Magnetic Interference (EMI) radiation from the semiconductor device. RF shielding is further required to prevent RF radiation from external sources from interfering with operation of the semiconductor device.

RF shielding for a microphone semiconductor device creates a particular issue. In microphone devices, a sound opening is formed in a substrate to allow the microphone to pick-up and receive sound waves. The sound opening must remain uncovered so that the microphone may properly receive the sound waves. However, the sound opening allows noise and other outside conditions to enter the device and interfere with the proper operation of different components of the device.

RF shielding for a microphone semiconductor device is generally accomplished in one of three ways. A first method is to attach a metal can over the component after the component is attached to the motherboard. An alternative to the shield attached method described above is an embedded RF shield. In an embedded shield, the metal RF shield is directly attached to the semiconductor package substrate by means of solder or a conductive adhesive. The shield may be fully embedded within the mold compound of the finished package or can be exposed after assembly. The third method is the conventional conformal shield. Conformal shielding is the latest technology to support integrated circuit (IC) devices and System in a Package (SiP) modules shielding. The conformal shielding creates a metallic coating, which is attached to ground metal in the substrate to provide a full shielding result. Presently, the conductive coating is applied to non-conductive surfaces, i.e., mold compound, substrate, etc.

All of the above methods provide an RF shield over a top surface of the microphone device. A ground guard is generally formed around the outer perimeter of the substrate. The RF shield is generally placed on a top surface of a substrate of the microphone device and attached to the grounding plane to provide the RF shielding. However, the sound opening on a bottom surface of the microphone device needs to remain uncovered so that the microphone may properly receive the sound waves. Thus, the sound opening allows noise and other outside conditions to interfere with the proper operation of the microphone device.

Therefore, a need existed to provide a system and method to overcome the above problem. The system and method would provide for RF shielding for a MEMS microphone package.

SUMMARY OF THE INVENTION

A semiconductor package has a substrate. An opening is formed through the substrate. A first RF shield is formed around a perimeter of the opening. A first die is attached to the first surface of the substrate and positioned over the opening.

The present invention is best understood by reference to the following detailed description when read in conjunction with the accompanying drawings.

BRIEF DESCRIPTION OF THE DRAWINGS

Common reference numerals are used throughout the drawings and detailed description to indicate like elements.

DETAILED DESCRIPTION

Figure 1:
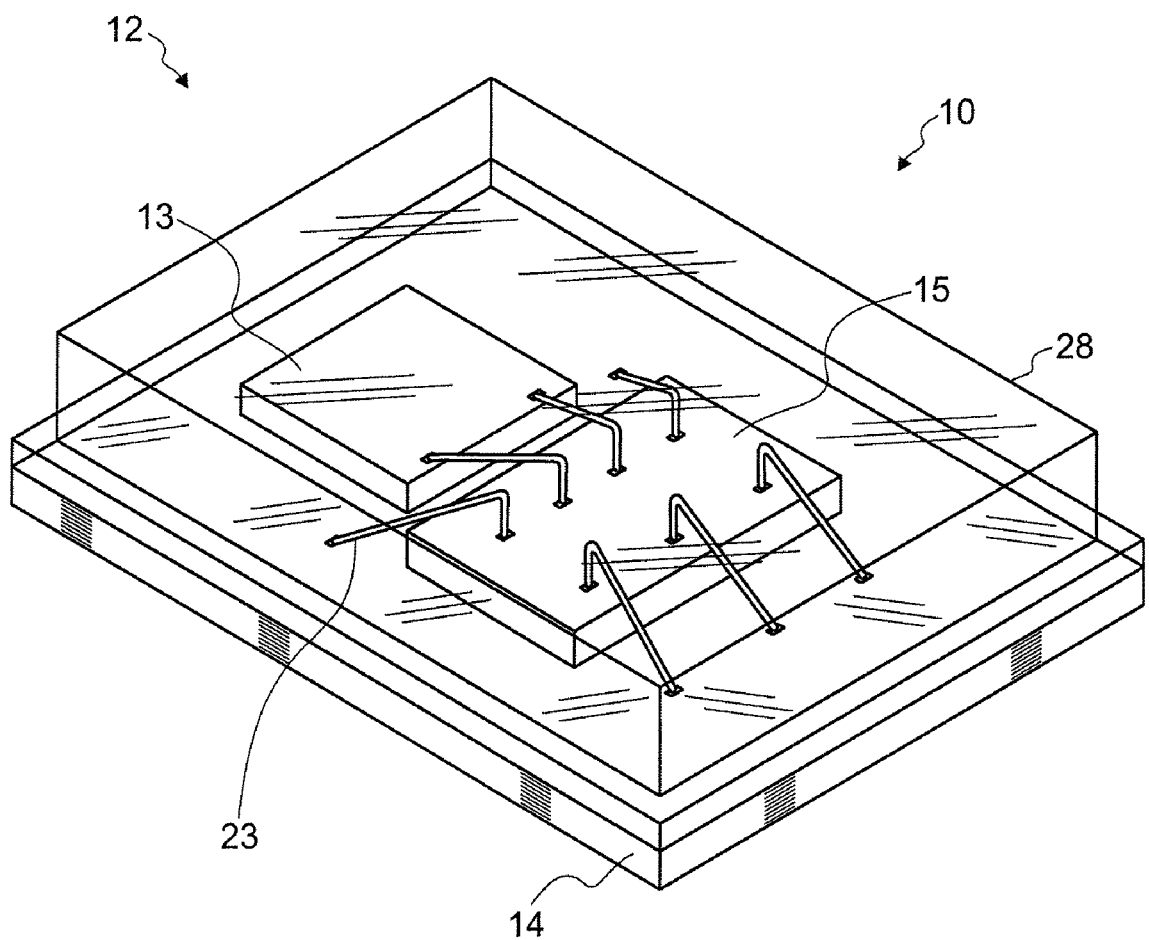
FIG. 1 is an elevated perspective view of a MEMS microphone package having RF shielding.

Referring to FIG. 1, an elevated perspective view of a semiconductor package 10 (hereinafter package 10) of the present invention is shown. The package 10 will have at least one electronic component 12. In the present embodiment, two electronic components 12 are shown attached to a substrate 14. One of the electronic components 12 is a transducer 13. More specifically, the transducer 13 is a MEMS microphone device which is able to receive sound waves and convert the sound waves to electrical signals. The second electronic component 12 is an amplifier 15. The amplifier 15 is used to increase the strength of the signals received by the transducer 13.

The electronic devices 12 are placed on a first surface of a substrate 14. The substrate 14 may be any one chosen from a conventional rigid Printed Circuit Board (PCB), a flexible PCB, a ceramic or an equivalent thereof, and the like. However, the above listing is only given as an example and the kind of substrate 14 is not limited herein. The transducer 13 is placed on the substrate 14 so to be positioned over an opening 16 (FIG. 2) formed through the substrate 14. The opening 16 is a sound opening that allows the transducer 13 to accurately receive sound waves and convert the sound waves to electrical signals and which provides a pressure reference for the transducer 13. The amplifier 15 is positioned on the first surface of the substrate 14 and next to the transducer 13. The transducer 13 and amplifier 15 are then electrically attached to metal traces 20 formed on the first surface of the substrate 14 and to each other. Different methods may be used to attach and electrically couple the electronic devices 12 to the substrate 14.

In the present embodiment, an adhesive is used to attach the amplifier 15 to the substrate 14. The adhesive may be a film, a paste or the like. The listing of the above is given as an example and should not be seen as to limit the scope of the present invention. Wirebonds 23 are then used to electrically connect the amplifier 15 to the metal traces 20 and to the transducer 13. The transducer 13 is attached to the substrate 14 via a bump bonding process. However, the above is given only as an example. The electronic devices 12 may be attached through other technologies such as surface mount technology, through hole technology, flip chip technology, and the like. The listing of the above is given as an example. Other technology may be used to electrically couple the electronic devices 12 without departing from the spirit and scope of the invention.

A metal can 28 is then placed over the electrical components 12. The metal can 28 is attached to a ground ring 29. The ground ring 29 is formed of a first metal layer 20 formed on a first surface of the substrate 14 which is connected to another metal layer 20 formed on a second surface of the substrate 14 through a plurality of vias 24 as shown in FIGS. 2-5. The ground ring 29 is generally formed around the outer perimeter of the substrate 14. The metal traces 20 on the first surface 19 and the second surface 21 connected to the vias 24 are ground planes. The metal can 28 is thus grounded and forms an RF shield around the perimeter of the substrate 14.

However, as stated above, the opening 16 allows noise and other outside conditions to enter and interfere with the proper operation of components of the package 10. Thus, an RF shield needs to be formed around the opening 16. Forming an RF shield around a perimeter of the opening 16 helps to reduce and/or prevent noise and RF energy through the substrate 14. Accordingly, the RF shield around the opening 16 provides shielding effectiveness for the overall operation of the package 10.

Figure 2:
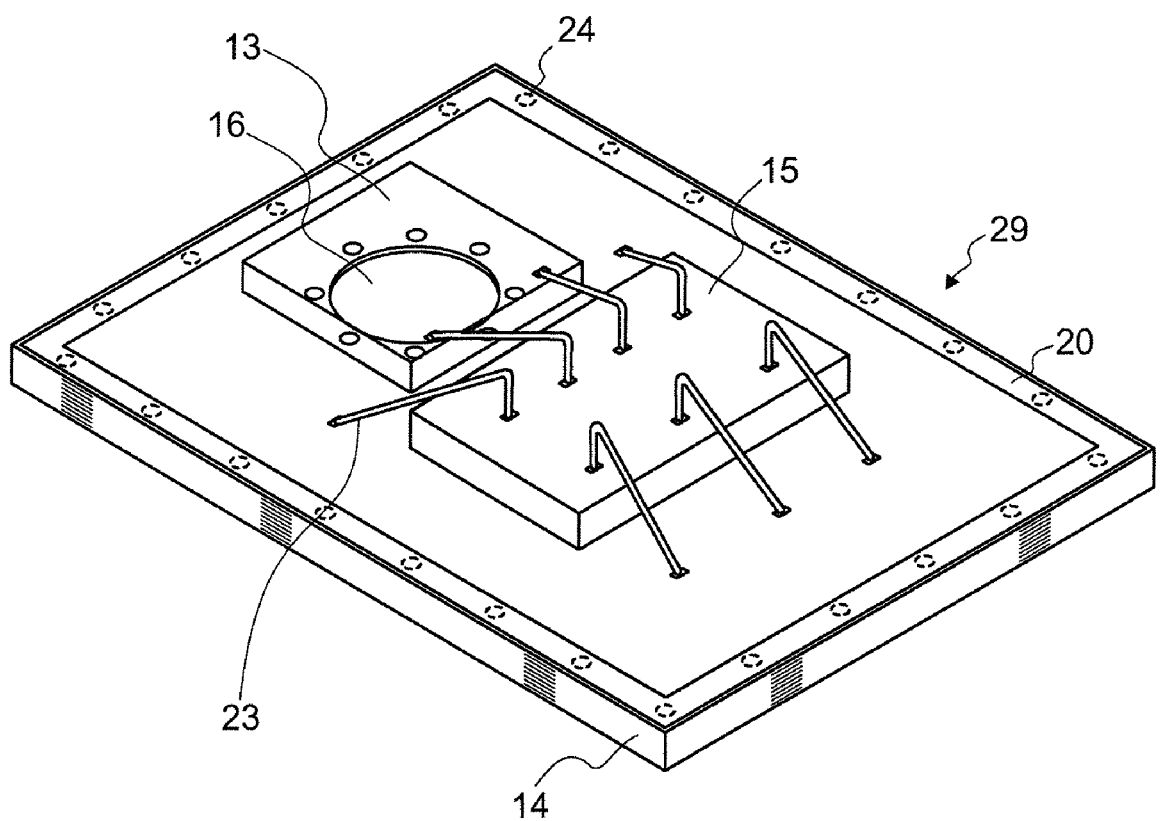
FIG. 2 is an elevated perspective view of the MEMS microphone package depicted in FIG. 1 with a metal can removed in accordance with one embodiment of the present invention.
Figure 4:
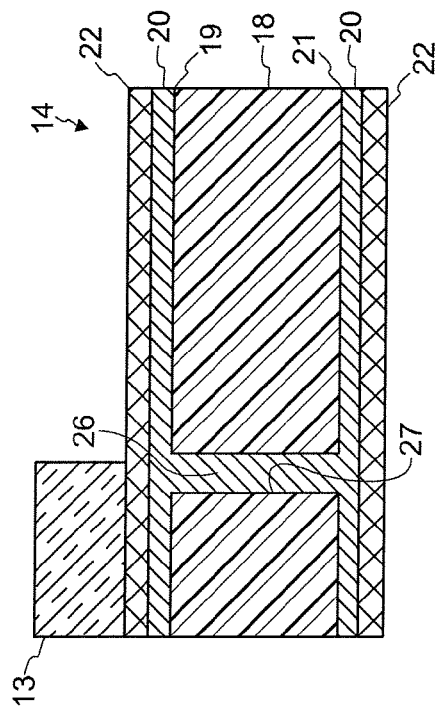
FIG. 4 is a cross-sectional view taken along lines 4-4 of FIG. 3.
Figure 3:
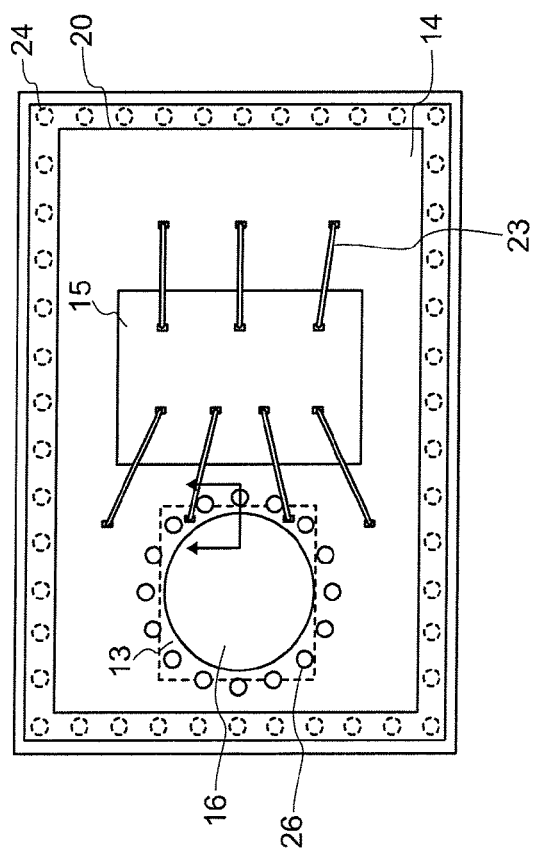
FIG. 3 is a top view of the MEMS microphone package depicted in FIG. 2.

Referring now to FIGS. 2-4, one embodiment of the RF shield formed around the opening 16 is disclosed. In the present embodiment, the substrate 14 generally includes an insulation layer 18 having predetermined area and thickness. The insulation layer 18 has an approximately planar first surface 19 and an approximately planar second surface 21 opposing the first surface 19. The substrate 14 has one or more of metal traces 20 formed on the first surface 19 of the insulation layer 18. One or more metal traces 20 may also be formed on the second surface 21. The substrate 14 may have multiple layers of metal traces 20. If multiple layers of metal traces 20 are formed, a dielectric layer is generally applied between the layers of metal traces 20. The dielectric layer is used an insulating layer to separate two metal layers. A solder mask 22 is generally placed over the top surface of the metal traces 20 formed on the first and second surfaces 19 and 21 respectively of the substrate 14. The solder mask 22 is generally a layer of polymer that provides a permanent protective coating for the metal traces 18. The solder mask 22 further prevents solder from bridging between metal traces 18, thereby preventing shorting.

The substrate 12 will have a ground ring 29 formed around the outer perimeter of the substrate 14. The ground ring 29 is formed of a first metal layer 20 formed on the first surface of the substrate 14 which is connected to another metal layer 20 formed on the second surface of the substrate 14 through a first plurality of vias 24. The first plurality of vias 24 is formed around the outer perimeter of the substrate 14. The first plurality of vias 24 are formed through the substrate 14 and will have a plating to electrically connect the metal trace 20 on the first surface 19 of the insulation layer 18 with the metal trace 20 formed on the second surface 21. The metal traces 20 on the first surface 19 and the second surface 21 connected to the vias 24 are ground planes thereby forming a shield around the perimeter of the substrate 14.

The substrate 14 will have a second plurality of vias 26 formed around the outer perimeter of the opening 16. The second plurality of vias 26 are formed through the substrate 14 and will have a plating 27 to electrically connect a metal trace 20 on the first surface 19 of the insulation layer 18 with a metal trace 20 formed on the second surface 21. The metal traces 20 on the first surface 19 and the second surface 21 connected to the vias 26 are ground planes thereby forming a shield around the perimeter of the opening 16. The shield formed by the second plurality of vias 26 reduces/prevents EMI/RF interference from carrier and modulation frequencies from entering the package 10. Thus, the shield formed by the second plurality of vias 26 around the opening 16 provides shielding effectiveness for the overall operation of the package 10. The number, pitch and diameter of the plated vias 26 may be changed to alter the shielding effect. Thus, the number of plated vias 26, spacing between vias 26 and/or diameter of the vias 26 may be increased to proved greater shielding coverage and may be lessened for devices that require less shielding.

It should be noted that in the embodiment shown in FIGS. 2-4, the transducer 13 is placed on the substrate 14 over both the opening 16 and the vias 26. However, the transducer 13 may be placed on the substrate 14 so to be positioned over just the opening 16. The vias 26 will be formed around the perimeter of the opening 16 and the transducer 13. Alternatively, the transducer 13 may be placed on the substrate 14 so to be positioned over the opening 16 and some of the vias 26.

The metal can 28 is then placed over the electrical components 12 and attached to the first plurality of metal vias 24. Since the metal traces 20 on the first surface 19 and the second surface 21 connected to the vias 24 are ground planes, the metal can 28 will be grounded thereby forming an RF shield around the perimeter of the substrate 14.

Figure 6:
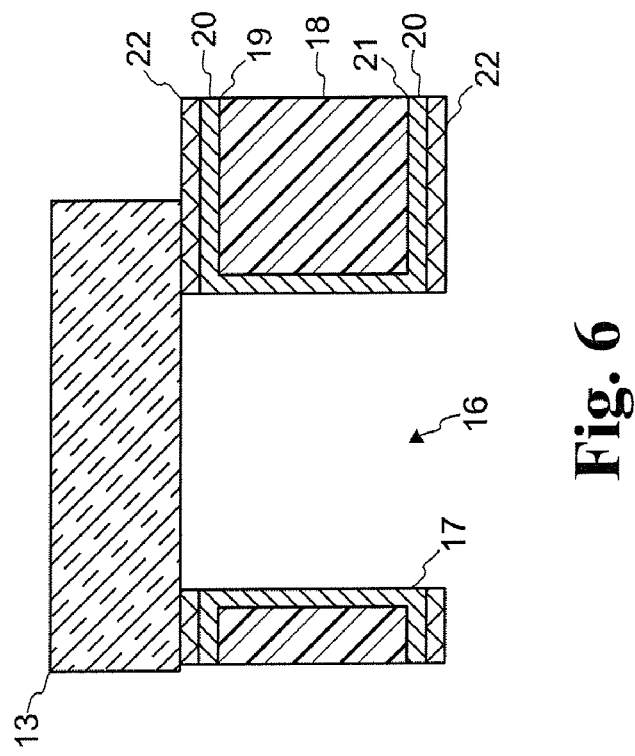
FIG. 6 is a cross-sectional view taken along lines 5-5 of FIG. 5.
Figure 5:
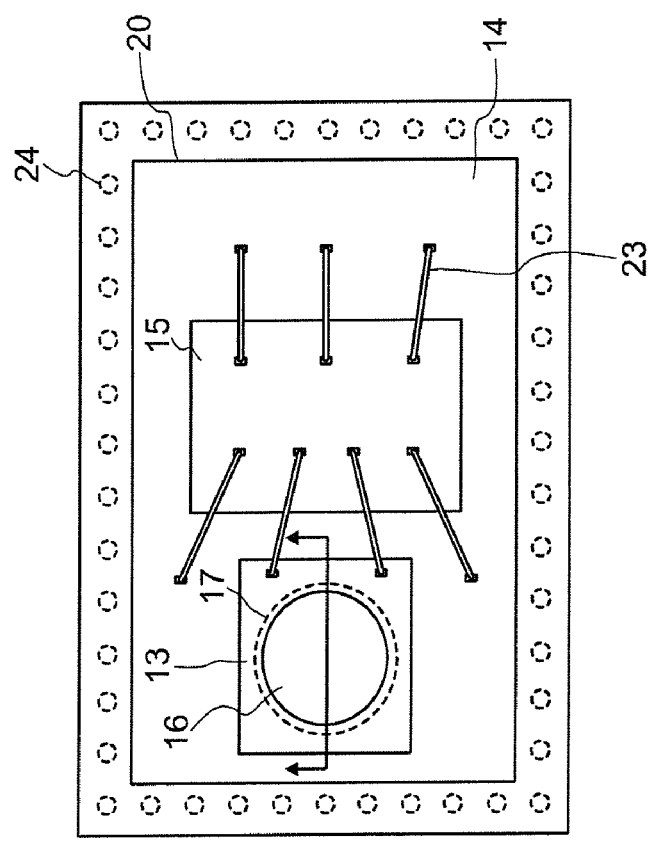
FIG. 5 is a top view of another embodiment of the MEMS microphone package of the present invention with the metal can removed.

Referring now to FIGS. 5-6, another embodiment of an RF shield formed around the sound opening 16 is shown. The substrate 14 will have a first plurality of vias 24 formed around the outer perimeter of the substrate 14. The first plurality of vias 24 are formed through the substrate 14 and will have a plating to electrically connect a metal trace 20 on the first surface 19 of the insulation layer 18 with a metal trace 20 formed on the second surface 21. The metal traces 20 on the first surface 19 and the second surface 21 connected to the vias 24 are ground planes thereby forming a shield around the perimeter of the substrate 14.

The opening 16 will have a plating layer 17 formed on the interior surface of the opening 16. The plating layer 17 will electrically connect a metal trace 20 on the first surface 19 of the insulation layer 18 with a metal trace 20 formed on the second surface 21. The metal traces 20 on the first surface 19 and the second surface 21 connected to the plating layer 17 are ground planes thereby forming a shield around the opening 16. The shield formed by the plating layer 17 in the opening 16 reduces EMI/RF interference from carrier and modulation frequencies from entering the package 10. Thus, the shield formed by the plating layer 16A around the opening 16 provides shielding effectiveness for the overall operation of the package 10.

The metal can 28 is then placed over the electrical components 12 and attached to the first plurality of metal vias 24. Since the metal traces 20 on the first surface 19 and the second surface 21 connected to the vias 24 are ground planes, the metal can 28 will be grounded thereby forming an RF shield around the perimeter of the substrate 14.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor package comprising:
   a substrate;
   an opening formed through the substrate;
   a first RF shield formed around a perimeter of the opening; and
   a first die attached to a first surface of the substrate and positioned over the opening;
   wherein the first RF shield comprises a plurality of first vias formed around a perimeter of the opening, each of the plurality of first vias formed around a perimeter of the opening electrically attached to ground planes formed on the first surface and a second surface of the substrate.

2. A semiconductor package in accordance with claim 1, further comprising:
   a plurality of second vias formed around a perimeter of the substrate, each of the plurality of second vias formed around the perimeter of the substrate electrically attached to ground planes formed on the first surface and a second surface of the substrate; and
   a second RF shield attached to the perimeter of first surface of the substrate and to the plurality of second vias formed around the perimeter of the substrate.

3. A semiconductor package in accordance with claim 1, further comprising a second die attached to the first surface of the substrate and electrically attached to the first die.

4. A semiconductor package in accordance with claim 1, wherein the first die is a transducer.

5. A semiconductor package in accordance with claim 2, wherein the second RF shield is a metal can.

6. A semiconductor package in accordance with claim 1, further comprising a plating layer formed in an interior surface of each of the plurality of first vias formed around the perimeter of the opening.

7. A semiconductor package in accordance with claim 2, further comprising a plating layer formed in an interior surface of each of the plurality of second vias formed around the perimeter of the substrate.

8. A semiconductor package in accordance with claim 1, wherein the substrate comprises:
   an insulative layer having a first surface and a second surface; and
   at least one metal layer applied to the first and second surfaces of the insulative layer.

9. A semiconductor package in accordance with claim 8, wherein the substrate further comprises a solder mask layer applied to the at least one metal layer applied to the first and second surfaces of the insulative layer.

10. A semiconductor package comprising:
    a substrate;
    an opening formed through the substrate;
    means for RF shielding formed around a perimeter of the opening; and
    a first die attached to the first surface of the substrate and positioned over the opening;
    wherein the means for forming an RF shield around a perimeter of the opening are a plurality of first vias formed around a perimeter of the opening, each of the plurality of first vias formed around the perimeter of the opening electrically attached to ground planes formed on the first surface and a second surface of the substrate.

11. A semiconductor package in accordance with claim 10, further comprising:
    means formed around a perimeter of the substrate for electrically attaching ground planes formed on the first surface and a second surface of the substrate; and
    an RF shield attached to the perimeter of first surface and to the means formed around a perimeter of the substrate.

12. A semiconductor package in accordance with claim 11, wherein the means formed around a perimeter of the substrate comprises a plurality of second vias formed around a perimeter of the substrate, each of the plurality of second vias formed around the perimeter of the substrate electrically attached to ground planes formed on the first surface and the second surface of the substrate.

13. A method of forming a semiconductor package comprising:
    providing a substrate having an opening formed through the substrate;
    forming an RF shield around a perimeter of the opening, wherein forming the RF shield around the perimeter of the opening comprises forming a first plurality of vias around a perimeter of the opening, wherein each of the first plurality of vias formed around a perimeter of the opening is electrically attached to ground planes formed on the first surface and a second surface of the substrate; and
    attaching a first die to the first surface of the substrate and positioned over the opening.

14. The method of claim 13, further comprising:
    forming a second plurality of vias around a perimeter of the substrate, each of the second plurality of vias formed around the perimeter of the substrate electrically attached to ground planes formed on the first surface and the second surface of the substrate; and
    attaching a second RF shield to the perimeter of first surface of the substrate and to the second plurality of vias formed around a perimeter of the substrate.

15. A semiconductor package in accordance with claim 1, further comprising a plurality of second vias formed around a perimeter of the substrate, each of the plurality of second vias formed around the perimeter of the substrate electrically attached to ground planes formed on the first surface and a second surface of the substrate for attaching a second RF shield around a perimeter of the substrate.

16. A semiconductor package in accordance with claim 10, further comprising means formed around a perimeter of the substrate for electrically attaching ground planes formed on the first surface and a second surface of the substrate and for attaching an RF shield to the perimeter of first surface.

17. A semiconductor package in accordance with claim 10, further comprising means formed around a perimeter of the substrate for grounding an RF shield to the perimeter of first surface.

* * * * *